United States Patent [19]

Sando et al.

[11] Patent Number: 4,466,258

[45] Date of Patent: Aug. 21, 1984

[54] APPARATUS FOR LOW-TEMPERATURE PLASMA TREATMENT OF A TEXTILE PRODUCT

[75] Inventors: Yoshikazu Sando, Wakayama; Tokuju Goto, Nara; Itsuo Tanaka, Osaka; Hiroshi Ishidoshiro; Matsuo Minakata, both of Wakayama, all of Japan

[73] Assignee: Sando Iron Works Co., Ltd., Japan

[21] Appl. No.: 452,101

[22] Filed: Dec. 22, 1982

[30] Foreign Application Priority Data

Jan. 6, 1982 [JP] Japan .................................... 57-817
Jan. 6, 1982 [JP] Japan .................................... 57-819

[51] Int. Cl.³ .............................................. D06B 3/00
[52] U.S. Cl. ........................................ 68/5 C; 8/444;
68/5 E; 118/50.1; 118/718; 118/723; 219/121 P; 427/38

[58] Field of Search ..................... 68/5 D, 5 E, 5 C; 8/149.2, 444; 427/38, 39; 118/50.1, 718, 723; 204/298; 34/36, 92; 219/121 P, 121 PY, 121 PD, 121 PE, 121 PF, 121 PG

[56] References Cited

U.S. PATENT DOCUMENTS

| 3,823,489 | 7/1974 | Boom ............................... 68/5 E X |
| 4,094,722 | 6/1978 | Yamamoto et al. ............. 204/298 X |
| 4,104,019 | 8/1978 | Smith ..................................... 8/444 |
| 4,262,631 | 4/1981 | Kubacki ........................... 427/39 X |

Primary Examiner—Philip R. Coe
Attorney, Agent, or Firm—Toren, McGeady and Stanger

[57] ABSTRACT

A method for low-temperature plasma treatment of a textile product such as a cloth comprising transporting a textile product to be treated through a reaction chamber, in which low-temperature plasma is produced in situ by applying high frequency electric wave to electrodes provided in the chamber uniformly without stay, for subjecting the textile product to low-temperature plasma treatment uniformly, and an apparatus therefor.

1 Claim, 4 Drawing Figures

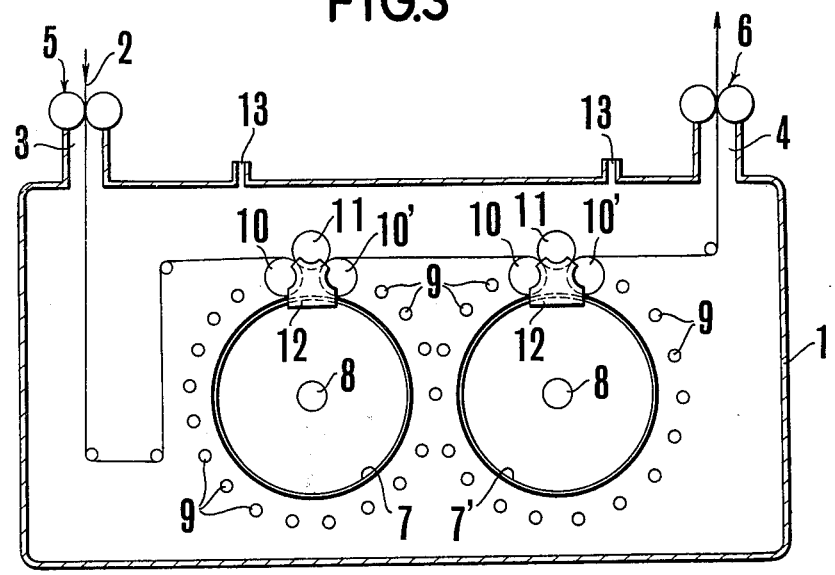
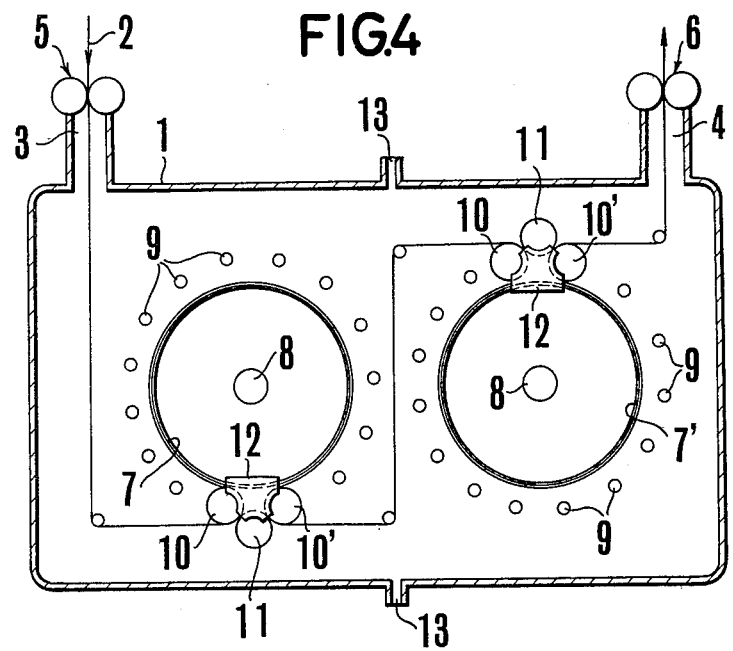

APPARATUS FOR LOW-TEMPERATURE PLASMA TREATMENT OF A TEXTILE PRODUCT

BACKGROUND OF THE INVENTION

The present invention relates to an apparatus for low-temperature plasma treatment of textile products such as knitted, woven and non-woven fabrics, strings and belts.

In the industrial treatment of a textile product such as a cloth, it is conventional that the textile product to be treated is subjected to a scouring process prior to dyeing, in which water repellent foreign matters adhering to the textile product is removed and the textile product is reformed to be hydrophilic, and the textile product is finished after dyeing to render the textile product soft, water repellent, anti-electrostatic and so on; and all the conventional processes are done in a water system.

For instance, in the scouring treatment of a cloth containing cotton, the cloth is treated with an alkaline solution containing such agent as caustic soda or soda ash and a scouring agent by boiling or by steaming for dissolving water repellent foreign matters contained in the cloth, then the cloth is repeatedly washed with water for removing solubilized foreign matters and the agents adhering to the cloth, and the cloth is finally dried. In the finishing process, the cloth is treated with a finishing agent dissolved or dispersed in water and filtered, and then water is evaporated by passing the cloth through a drier. According to the kind of treatment, it is necessary further to fix the finishing agent to the cloth by a high temperature heat treatment.

Under such circumstances, it has recently been proposed to subject a textile product such as a cloth to low-temperature plasma treatment for desizing, scouring and so on. In the conventionally proposed processes, however, the low-temperature plasma treatment of a textile product is done while a long textile product taken up on a shaft or a roll is transferred to another shaft or roll in a batch. The taken-up long textile product is placed in the low-temperature plasma atmosphere in the batch during operation. While both end parts of the taken-up long textile product is always exposed to the low-temperature plasma atmosphere, the interior of the textile product is in contact with the low-temperature plasma for the first time when the textile product is transferred to the other shaft or roll, and therefore, there occurs such a trouble that the treatment becomes uneven.

SUMMARY OF THE INVENTION

The object of the present invention is to offer an apparatus for treating a long textile product such as a cloth uniformly by utilizing low-temperature plasma produced in situ in a reaction chamber with the limited use of heat energy and water resource.

The principle of the invention is to pass a textile product to be treated through a low-temperature plasma atmosphere uniformly without stay for treating the textile product uniformly. In the case of scouring, for instance, water repellent foreign matters adhering on the surface and among the textile product are decomposed due to the effect of low-temperature plasma produced in situ forming hydrophilic products, and particularly scouring can be done up to the core parts of the fabrics uniformly. In finishing treatment, the treatment can be done in gas phase, particularly sparing the agent, heat energy and water resources. The present invention can also eliminate the problem of public pollution due to waste liquor.

BRIEF DESCRIPTION OF THE DRAWINGS

FIG. 3 is another example of the present inventive apparatus, and

FIG. 4 is a modification thereof.

DETAILED DESCRIPTION OF THE PREFERRED EMBODIMENTS

The preferred embodiments of the present invention will be described in detail in the following with reference to the examples of the present inventive apparatus shown in the attached drawings.

EXAMPLE 1

Figure 1:
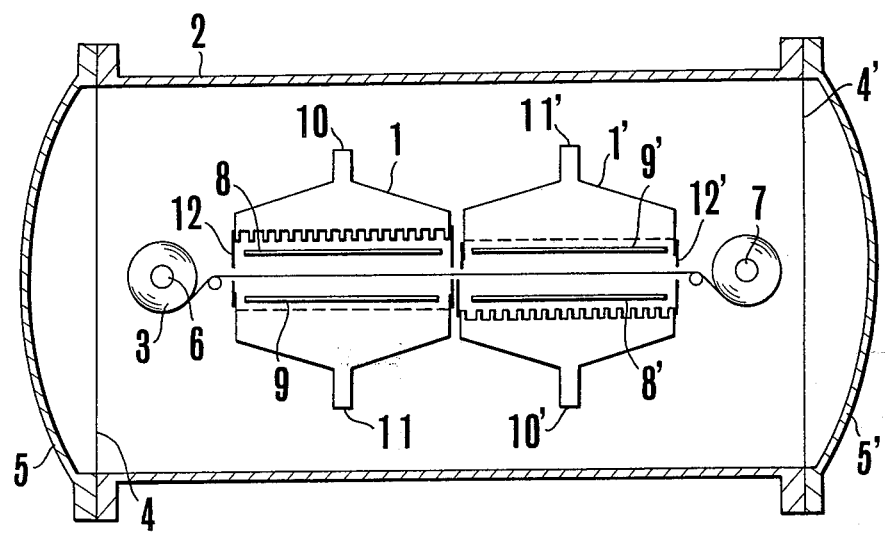
FIG. 1 is an example of the present inventive apparatus for low-temperature plasma treatment of a textile product.

In FIG. 1, 1 and 1' are reaction chambers provided in a reduced pressure vessel 2. Openings 4 and 4' are provided to the reduced pressure vessel 2 for taking in and out of a textile product to be treated such as a cloth 3, and the openings 4 and 4' are designed so that they can be closed with the use of covers 5 and 5'. 6 and 7 are cloth taking-up shafts provided near the openings 4 and 4' in the reduced pressure vessel 2. The cloth taking-up shafts 6 and 7 are designed so that they can be rotated in the plus and minus directions intermittently for taking up and reversing the textile product. 8, 9 and 8', 9' are respectively a pair of electrode plates. High frequency electric waves produced by an oscillator provided outside of the reduced pressure vessel are supplied, for instance, to the electrode plates 8 and 8', and the other electrode plates 9 and 9' are earthed. The direction of plus and minus of the pair of the electrode plates 8 and 9 are reversed to that of the pair of the electrode plates 8' and 9'. The electrode plates 8, 8' and 9, 9' are made of metal wire gauge or porous metal plate for distributing gas uniformly all over the electrode plates. Thus, possibly uniform low-temperature plasma is produced from the total surface of the electrode plates, and the gas activated by the high frequency electric wave floats nearly uniformly in the vicinity of the electrode plates. 10 and 10' are gas nozzles for blowing gas from outside of the reduced pressure vessel 2 to the total surface of the electrode plates 8 and 8', and 11 and 11' are gas ducts provided at the opposite direction of the electrode plates for taking out the gas to the outside of the reduced pressure vessel. As obvious from the figure, the textile product 3 receives activated gas from the opposite directions alternately in the reaction chambers 1 and 1'. 12 and 12' are covers provided around the electrode plates 8, 8' and 9, 9', and the low-temperature plasma produced at the electrode plates is prevented from scattering and acts effectively to the textile product.

The construction of the apparatus of this example is as above described. Now, its functions will be explained in the following.

In the first place, a cloth taking-up shaft, for instance the shaft 6, on which a long cloth 3 has been taken up is set in the reduced pressure vessel 2, the front end of the said cloth 3 is taken up to the other cloth taking-up shaft 7 so that the cloth can be taken up successively thereto, and the covers 5 and 5' are set for closing the reduced pressure vessel 2. Then, a vacuum pump (not shown in the figure) connecting to the gas ducts 11 and 11' is operated and a gas is supplied from the gas nozzles 10 and 10' so as to control the vacuum degree of the interior of the reduced pressure vessel 2 to from 0.1 to 10 Torr, or desirably from 0.5 to 2 Torr. High frequency electric wave with a frequency of, for instance, 13.56 MHz is supplied to the electrode plates from a high frequency electric source for generating low-temperature plasma. The cloth taking-up shafts are driven for passing the cloth 3 through the two electrode plates in the low-temperature plasma atmosphere. In passing the cloth through low-temperature plasma atmosphere in this way, low-temperature plasma gas particles permeate in the fibers of the cloth from both sides thereof, and low-temperature plasma reacts up to the core part of the cloth effectively. In the case of scouring, foreign matters contained in the surface and core part of the cloth 3 and a part of sizing agent are easily decomposed and partially change to hydrophilic, and they are easily dissolved in water to spare the washing water. The treating conditions for producing low-temperature plasma in the above, for instance, the electric power output, the kind of gas, the gas flow rate and the treating time, can freely be selected according to the kind of textile product to be treated and the object of the treatment.

Figure 2:
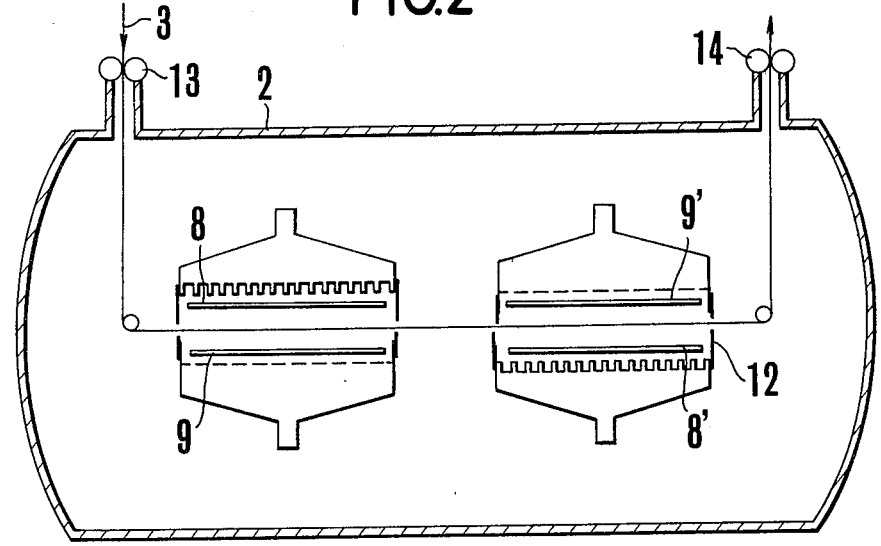
FIG. 2 is a modification thereof.

While the apparatus in this example is of a batch type, it is possible to perform low-temperature plasma treatment of a textile product continuously by using an apparatus as shown in FIG. 2, in which seal mechanisms 13 and 14 are provided for maintaining the interior of the reduced pressure vessel 2 at a sufficiently reduced pressure while allowing the pass of the textile product to be treated 3 continuously therethrough.

As above described in detail, this example is an apparatus for low-temperature plasma treatment of a textile product such as a cloth comprising providing two reaction chambers in series in a reduced pressure vessel, said reaction chamber having respectively, a pair of electrode plates, to which high frequency electric wave can be applied, provided at the opposed directions with each other by putting a passage of a textile product to be treated therebetween, a gas nozzle for jetting a gas from outside of the reduced pressure vessel to the electrode plates, and a gas duct provided at the opposite position to the gas nozzle for exhausting the gas and evacuating the reduced pressure vessel.

According to this apparatus, therefore, the textile product to be treated receives the action of low-temperature plasma from both surfaces up to the core part thereof effectively. Moreover, due to the treatment of a textile product by low-temperature plasma, heat energy, water resource and treating agents can be spared as compared with the conventional methods. The treatment of textile products can be done economically with no problem of public pollution.

EXAMPLE 2

In another example of the present inventive apparatus shown in FIG. 3, 1 is a reaction chamber provided with a cloth inlet 3 and a cloth inlet 4 for taking in and out of a cloth to be treated continuously, and the cloth inlet 3 and cloth outlet 4 are provided respectively with seal mechanisms 5 and 6 which can pass a cloth continuously by maintaining the interior of thereaction chamber 1 to reduced pressure with a vacuum degree of 0.1 to 10 Torr or desirably 0.5 to 2 Torr. The seal mechanism for 5 and 6 have been developed by the present applicant.

7 and 7' are two cloth guide drums freely rotatble provided in parallel in the reaction chamber 1. The guide drums 7 and 7' are made of non-conductive material having permeablility such as a net. 8 is a vacuum pipe provided respectively at the position of the rotation center of the cloth guide drums 7 and 7', and the end part of the vacuum pipe 8 is connected to a vacuum pump (not shown in the figure). This vacuum pipe is earthed with a conductive material. 9 are a plurality of electrode rods provided around the two guide drums 7 and 7' with proper intervals, and these electrode rods are connected to an oscillator (not shown in the figure) for supplying high frequency electric wave therefrom. The electrode rods may be substituted with electrode plates made of such materials as a metal wire gauge and a porous metal plate surrounding the cloth guide drum, 10 and 10' are respectively a pair of guide rolls for guiding the cloth around the guide drums 7 and 7', and a seal roll 11 and an end face seal plate 12 are provided respectively between the guide rolls 10 and 10' for sealing the space between the two guide rolls. Thus, the permeation effect of the cloth in contact with the guide drums 7 and 7' is elevated for increasing the permeability of the low-temperature plasma to the cloth 2. 13 is a gas supply inlet.

In applying this apparatus to the scouring of a textile product composed of 100% cotton or a mixture of cotton and such materials as polyester, vinylon, nylon, wool, hemp, jute, acetate and rayon, a non-scoured and dried cloth 2 is guided through the guide drums 7 and 7' continuously by rotating the drums in the reaction chamber 1. Then, the vacuum pump connecting to the vacuum pipe is driven for reducing the pressure of the interior of the reaction chamber 1 to a vacuum degree of less than 1 Torr or desirably less than 0.5 Torr, and a definite gas is supplied from the gas supply inlet 13 to the reaction chamber 1. By controlling the amount of the gas supplied and exhausted, the vacuum degree of the interior of the reaction chamber is controlled to 0.1 to 10 Torr or desirably to 0.5 to 2 Torr. The reason why the vacuum degree is defined to 0.1 to 10 Torr is that the occurrence of low-temperature plasma becomes unstable when the vacuum degree is above 10 Torr, and on the other hand, when the vacuum degree is maintained to not more than 0.1 Torr, not only the maintenance and operation cost become high in the points of the capacity of the vacuum pump and the seal mechanism but also the concentration of the low-temperature plasma becomes low to deteriorate the treating effect.

After controlling the vacuum degree of the reaction chamber 1 in the presence of a definite gas, high frequency electric wave is applied to the electrode rods 9, and thus low-temperature plasma is produced between the electrode plates and the earthed vacuum pipe, i.e., in the reaction chamber 1. The frequency of high frequency electric wave for producing low-temperature plasma may be in the range from long wave to short wave, but the desirable range is from 1 KHz to 300 MHz.

When high frequency electric wave is applied to a gas, for instance, pure oxygen gas or a gas containing oxygen, in the reaction chamber with a reduced pressure of 0.1 to 10 Torr, oxygen molecules are excited to produce low-temperature plasma. In sucking the gas through the vacuum pipe 8, the activated gas passes through the cloth guided by the guide drums 7 and 7', and the gas containing low-temperature plasma is absorbed up to the core part of the fibers of the cloth. Due to the effect of low-temperature plasma, foreign matters contained in the cloth are decomposed by oxidation, and the hydrophilic property and the permeability of the cloth can largely be improved.

A modification of the apparatus of this type is as shown in FIG. 4. In this modification, as understood from the figure, low-temperature plasma permeates from the front side of the cloth 2 to the back side thereof in passing the cloth through the guide drum 7 and vice versa in passing the cloth through the guide drum 7', so that both sides of the cloth can equally be treated.

While a pair of guide drums are provided in the reaction chamber in the above example, the guide drum may be only one or more than two.

As above described in detail, this example is an apparatus for low-temperature plasma treatment of a textile product such as a cloth comprising a reaction chamber provided with seal mechanisms which can maintain the interior of the chamber to reduced pressure while allowing the transportation of a cloth to be treated therethrough, one or more guide drums having permeability provided in the reaction chamber for transporting the cloth therearound, and a gas supply inlet for supplying a gas to the reaction chamber, said guide drums having respectively a plurality of electrodes provided around the outer circumference thereof with appropriate intervals, to which high frequency electric wave can be applied, and a vacuum pipe connecting to a vacuum pump provided at the rotation center thereof.

The effect of this example is the same as in the preceding example.

What we claim:

1. An apparatus for low-temperature plasma treatment of a textile product, comprising two reaction chambers arranged in series in a reduced pressure vessel, two opposing electrode plates arranged in each said chambers forming a passage of a textile product to be treated therebetween, each of said chambers having a gas nozzle for jetting a gas from outside of the reduced pressure vessel to the electrode plates, and a gas duct provided at the opposite position to the gas nozzle for exhausting the gas and evacuating the reduced pressure vessel, the combination of plates and gas nozzles operating to produce the plasma.

* * * * *